(12) United States Patent
Ohshita et al.

(10) Patent No.: US 6,811,808 B2
(45) Date of Patent: Nov. 2, 2004

(54) ORGANIC ELECTROLUMINESCENT DISPLAY PANEL AND METHOD OF MANUFACTURING THE SAME

(75) Inventors: Isamu Ohshita, Yamagata (JP); Ryuji Murayama, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 254 days.

(21) Appl. No.: 09/789,586

(22) Filed: Feb. 22, 2001

(65) Prior Publication Data

US 2001/0019245 A1 Sep. 6, 2001

(30) Foreign Application Priority Data

Feb. 22, 2000 (JP) .................................. P. 2000-044629
Mar. 23, 2000 (JP) .................................. P. 2000-081931

(51) Int. Cl.$^7$ .............................. B05D 5/12; B05D 5/06
(52) U.S. Cl. ........................... 427/66; 427/68; 428/690; 313/504
(58) Field of Search ............... 427/66, 68; 313/504; 428/690

(56) References Cited

U.S. PATENT DOCUMENTS

| | | | | |
|---|---|---|---|---|
| 5,151,629 A | * | 9/1992 | VanSlyke | 313/504 |
| 5,294,869 A | * | 3/1994 | Tang et al. | 313/504 |
| 5,409,783 A | * | 4/1995 | Tang et al. | 428/690 |
| 5,641,611 A | * | 6/1997 | Shieh et al. | 430/321 |
| 5,645,948 A | * | 7/1997 | Shi et al. | 428/690 |
| 5,701,055 A | * | 12/1997 | Nagayama et al. | 313/504 |
| 6,004,685 A | * | 12/1999 | Antoniadis et al. | 428/690 |
| 6,013,538 A | * | 1/2000 | Burrows et al. | 438/22 |
| 6,020,078 A | * | 2/2000 | Chen et al. | 428/690 |
| 6,255,775 B1 | * | 7/2001 | Ikuko et al. | 313/506 |
| 6,339,288 B1 | * | 1/2002 | Qian et al. | 313/498 |
| 6,366,016 B1 | * | 4/2002 | Sakaguchi et al. | 313/506 |
| 6,384,529 B2 | * | 5/2002 | Tang et al. | 313/506 |
| 6,541,130 B2 | * | 4/2003 | Fukuda | 428/690 |

* cited by examiner

*Primary Examiner*—Michael Cleveland
(74) *Attorney, Agent, or Firm*—Sughrue Mion, PLLC

(57) ABSTRACT

A method of manufacturing an organic electroluminescent display panel includes the steps of: forming first electrodes on the substrate; forming organic layers by deposition; forming different light emitting layers for different luminous colors in desired areas; and forming second electrodes; wherein the organic layers are formed by an angle deposition method which performs deposition at more than a predetermined angle to the normal of the substrate.

10 Claims, 12 Drawing Sheets

FIG. 8

| PROCESS | LAYER NO. | ORGANIC EL MEDIUM LAYER | FILM THICKNESS (nm) | | |
|---|---|---|---|---|---|
| | | | R | G | B |
| 1-2 | 21A | HOLE TRANSPORT LAYER (DIFFERENCE) | 0 | 20 | 50 |
| 3 | 21B | HOLE TRANSPORT LAYER (COMMON) | 50 | 50 | 50 |
| 4 | 22A | LIGHT EMITTING LAYER (R) | d(R) | — | — |
| 5 | 22B | LIGHT EMITTING LAYER (G) | — | d(G) | — |
| 6 | 22C | LIGHT EMITTING LAYER (B) | — | — | d(B) |
| 7-8 | 23A | ELECTRON TRANSPORT LAYER (DIFFERENCE) | 60 | 0 | 30 |
| 9 | 23B | ELECTRON TRANSPORT LAYER (COMMON) | 20 | 20 | 20 |

ORGANIC ELECTROLUMINESCENT DISPLAY PANEL AND METHOD OF MANUFACTURING THE SAME

BACKGROUND OF THE INVENTION

1. Field of the Invention

The present invention relates to a display panel using organic electroluminescence devices (hereafter referred to as organic EL devices) and a method of manufacturing the display panel, and more particularly to an organic EL color display panel having light emitting portions in a plurality of luminous colors and to a method of manufacturing the organic EL color display panel.

2. Description of the Related Art

There have been disclosed conventional organic EL display panels, for example, in JP-A8-315981, 10-312886 and 11-194585.

In such organic EL display panels, during the process of making an organic EL display panel, it is generally difficult to pattern organic EL medium layers or electrode layers after forming the organic EL medium layers because of low heat resistance, low solvent resistance and low humidity resistance of the organic EL medium used in charge injection layers and light emitting layers. For example, when the photolithography generally used to pattern thin films is used for the patterning in the organic EL display panel, a problem arises that the organic EL device characteristics are degraded by infiltration of solvent into photoresist, by a high-temperature ambient gas during baking of photoresist, by infiltration of photoresist development liquid into the devices, or by damages to devices by plasma during dry etching.

Other examples of the patterning method include a vapor deposition method that uses a mask to pattern the organic EL medium layers and electrode layers. However, because of the wraparound of vapor that may occur in gaps between the mask and the substrate and the shadowing caused by projections and debris, the coverage of the organic EL medium may become insufficient. This in turn causes characteristic degradations during the operation of the organic EL display panel, such as current leakage and poor emission of light, which stand in the way of performance enhancement of the organic EL display panel.

Also, in the conventional full color organic EL display panel, when the same organic EL material is used commonly for the organic EL medium layers of different luminous colors, the layers are formed under the same conditions irrespective of the colors. Hence, the light emitting characteristics of the individual light emitting portions cannot be optimized according to the colors, which is detrimental to enhancing the performance of the full color organic EL display panel.

SUMMARY OF THE INVENTION

The present invention has been accomplished under these circumstances to provide a high performance organic EL display panel and a method of manufacturing such a display panel.

In order to achieve the above object, according to one aspect of the invention, there is provided a method of manufacturing an organic electroluminescent display panel having light emitting portions in a plurality of luminous colors formed on a substrate, the method comprising: a step of forming first electrodes on the substrate; an organic layer forming step of forming organic layers by deposition; a light emitting layer forming step of forming different light emitting layers for different luminous colors in desired areas; and a step of forming second electrodes; wherein in the organic layer forming step, the organic layers are formed by an angle deposition method.

According to the present invention, there is provided a method of manufacturing an organic electroluminescent display panel having light emitting portions in a plurality of luminous colors formed on a substrate, the method comprising: a step of forming first electrodes on the substrate; a first organic layer forming step of simultaneously forming same first organic layers common to all the luminous colors in light emitting areas by deposition; a second organic layer forming step of forming different second organic layers for different luminous colors in desired areas by deposition; a light emitting layer forming step of forming different light emitting layers for different luminous colors in desired areas; and a step of forming second electrodes; wherein the first organic layers are formed by an angle deposition method and the second organic layers are deposited at a deposition angle smaller than that of the angle deposition method.

According to the present invention, there is provided an organic electroluminescent display panel having light emitting portions in a plurality of luminous colors formed on a substrate; the display panel comprising: first electrodes formed on the substrate; organic layers formed by deposition; light emitting layers formed in desired areas according to the luminous colors; and second electrodes; wherein the organic layers are formed by an angle deposition method.

According to the present invention, there is provided an organic electroluminescent display panel having light emitting portions in a plurality of luminous colors formed on a substrate; the display panel comprising: first electrodes formed on the substrate; first organic layers formed in light emitting areas at one time by deposition; second organic layers formed in desired areas and being different among different luminous colors; and second electrodes; wherein the first organic layers are formed by an angle deposition method and the second organic layers are deposited at a deposition angle smaller than that of the angle deposition method.

According to another aspect of the present invention, there is provided a method of manufacturing an organic electroluminescent display panel having light emitting portions in a plurality of luminous colors formed on a substrate, the method comprising: a step of forming first electrodes on the substrate; an organic layer forming step of forming organic layers in associated light emitting areas, the organic layers having different thicknesses for different luminous colors; a light emitting layer forming step of forming light emitting layers for different luminous colors in the associated light emitting areas; and a step of forming second electrodes.

According to the present invention, there is provided a method of manufacturing an organic electroluminescent display panel having light emitting portions in a plurality of luminous colors formed on a substrate, the method comprising: a step of forming first electrodes on the substrate; a first organic layer forming step of forming organic layers in associated light emitting areas on the substrate on which the first electrodes were formed, the organic layers having different thicknesses for different luminous colors; a light emitting layer forming step of forming light emitting layers for different luminous colors in the associated light emitting areas after performing the first organic layer forming step; and a step of forming second electrodes after performing the light emitting layer forming step.

According to the present invention, there is provided an organic electroluminescent display panel having light emitting portions in a plurality of luminous colors formed on a substrate; the display panel comprising: first electrodes formed on the substrate; first organic layers having different thicknesses for different luminous colors in associated light emitting areas on the substrate on which the first electrodes were formed; light emitting layers formed on the first organic layers on the light emitting areas corresponding to the different luminous colors; and second electrodes formed on the light emitting layers.

BRIEF DESCRIPTION OF THE DRAWINGS

FIG. 8 is a table showing the process of forming organic EL medium layers in the organic EL display panel according to a third embodiment of the invention;

DETAILED DESCRIPTION OF THE PREFERRED EMBODIMENTS

Figure 1:
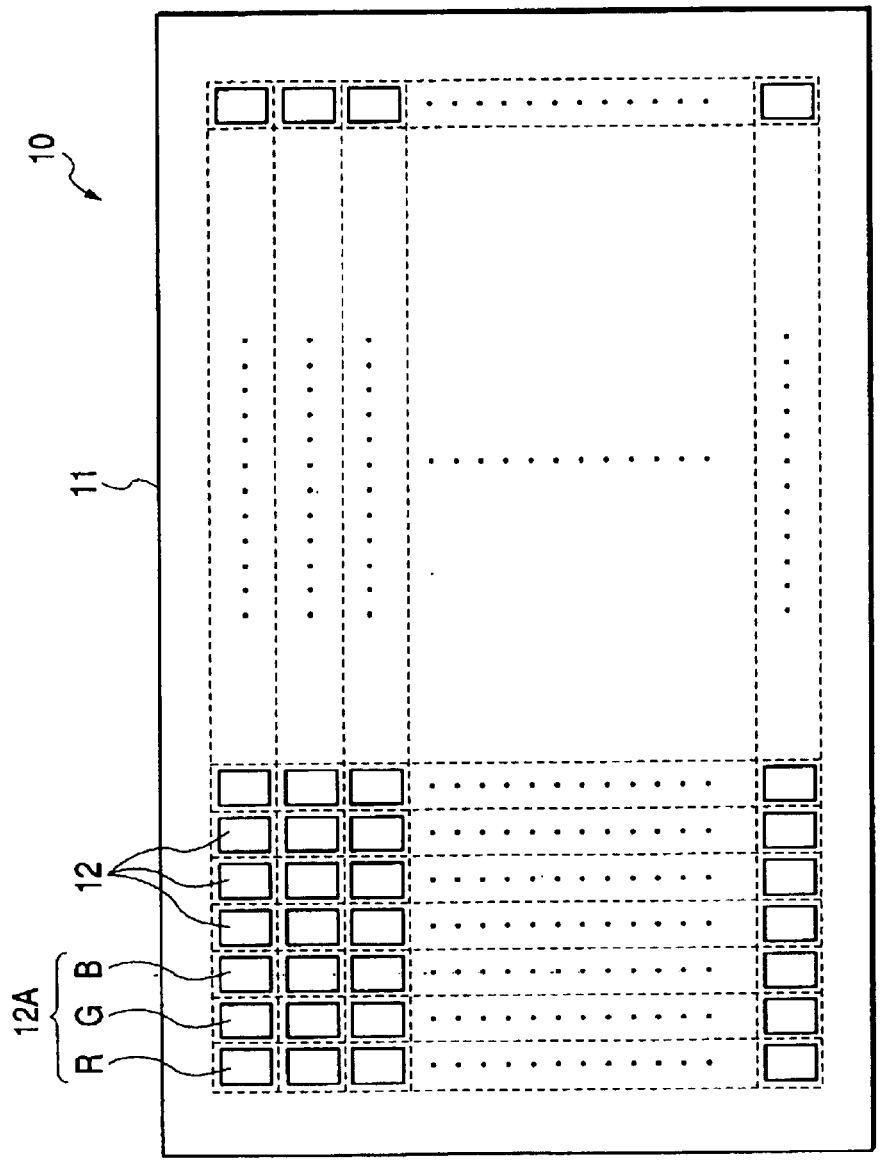
FIG. 1 is a plan view schematically showing an example array of luminous pixels on a full color organic EL display panel according to a first embodiment of this invention.

Embodiments of the organic EL display panel and of the method of manufacture thereof will be described in detail by referring to the accompanying drawings. In the drawings elements that are virtually identical are assigned like reference numerals.

(First Embodiment)

FIG. 1 is a plan view schematically showing an example array of luminous pixels on a full color organic EL display panel 10 as a first embodiment of this invention. As shown in the figure, the organic EL display panel 10 has an image display array made up of a plurality of luminous pixels 12A each consisting of red (R), green (G) and blue (B) light emitting portions 12.

Figure 2:
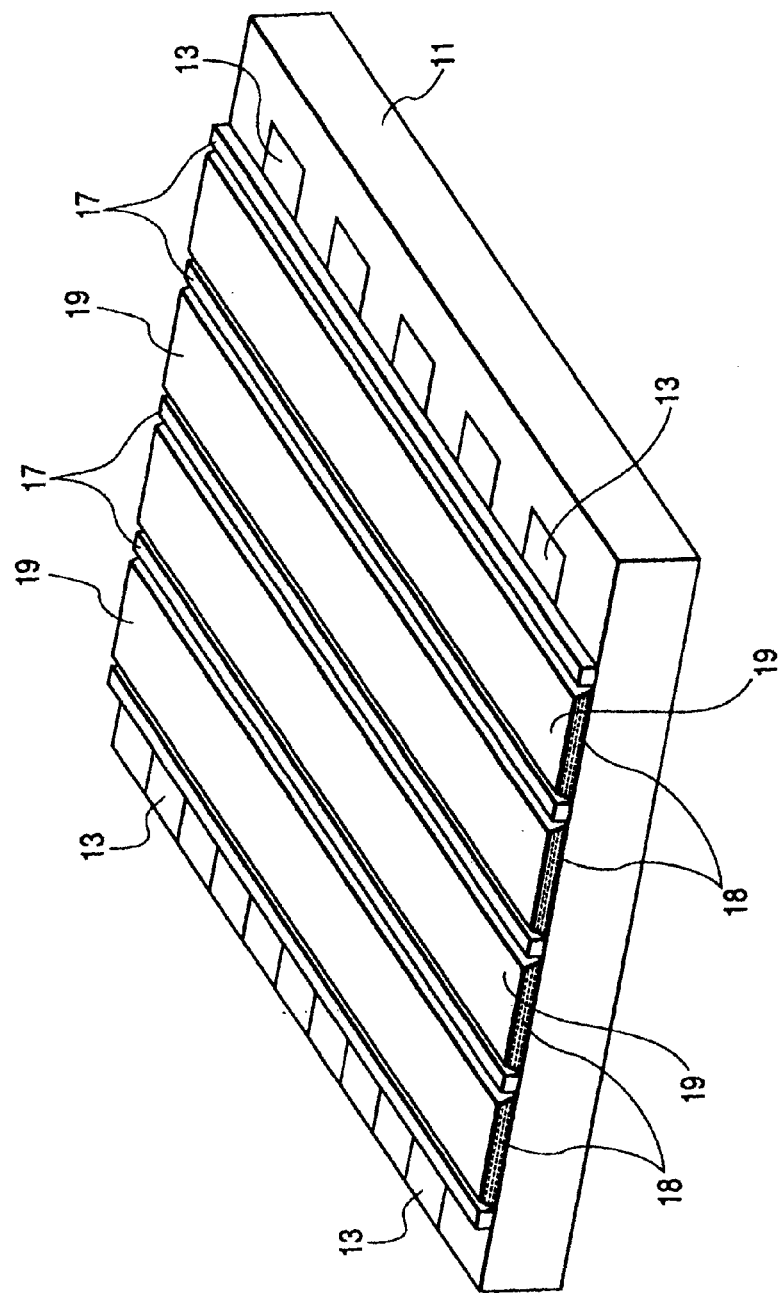
FIG. 2 is a perspective view schematically showing a part of the organic EL display panel.

FIG. 2 is a perspective view schematically showing a part of the organic EL display panel 10. As shown in the figure, in the organic EL display panel 10 first electrodes 13 (anodes) made of indium-tin oxide film (hereafter referred to as an ITO film) are arranged on the transparent substrate 11 made of, for example, glass. The first electrodes 13 are arrayed in a plurality of parallel stripes. A plurality of insulating separation walls 17 projecting from the substrate 11 are formed over the substrate 11 and the first electrodes 13 so that they are perpendicular to the first electrodes 13. That is, the separation walls 17 are formed to expose parts of the first electrodes 13.

In areas between the separation walls 17, at least one layer of an organic EL medium layer 18 is formed over the first electrodes 13. For example, the organic EL medium layer 18 is a single layer of organic EL luminous layer, or includes in addition to the organic EL luminous layer an organic hole injection layer, an organic hole transport layer, an organic electron transport layer or an organic electron injection layer.

Over the organic EL medium layers 18 are formed second electrodes 19 (cathodes) that extend along the lengths of the organic EL medium layers 18. Portions sandwiched between the crossing first electrodes 13 and second electrodes 19 correspond to the light emitting portions. The adjacent second electrodes 19 on the organic EL medium layers 18 are electrically isolated from each other by the separation walls 17 to prevent the second electrodes from becoming shorted. Hence, as shown in FIG. 2, the separation walls 17 are preferably formed in an overhang shape such as an inverted taper and T-letter shape.

Over the second electrodes 19 of the passive-matrix organic EL display panel 10, a protective film or protective substrate (not shown) maybe formed. In the organic EL display panel 10, because the substrate 11 and the first electrodes 13 are transparent and the luminescent light is emitted from the substrate side, a reflection film (not shown) is preferably provided on the second electrodes 19 with or without a protective film interposed in order to enhance the luminous efficiency of the organic EL display panel 10. It is also possible to form the second electrodes 19 from a transparent material contrary to the above-described organic EL display panel 10 and emit luminescent light from the second electrode side. In that case, to increase the luminous efficiency a reflection film is preferably provided on the outer side of the first electrodes 13.

Figure 3:
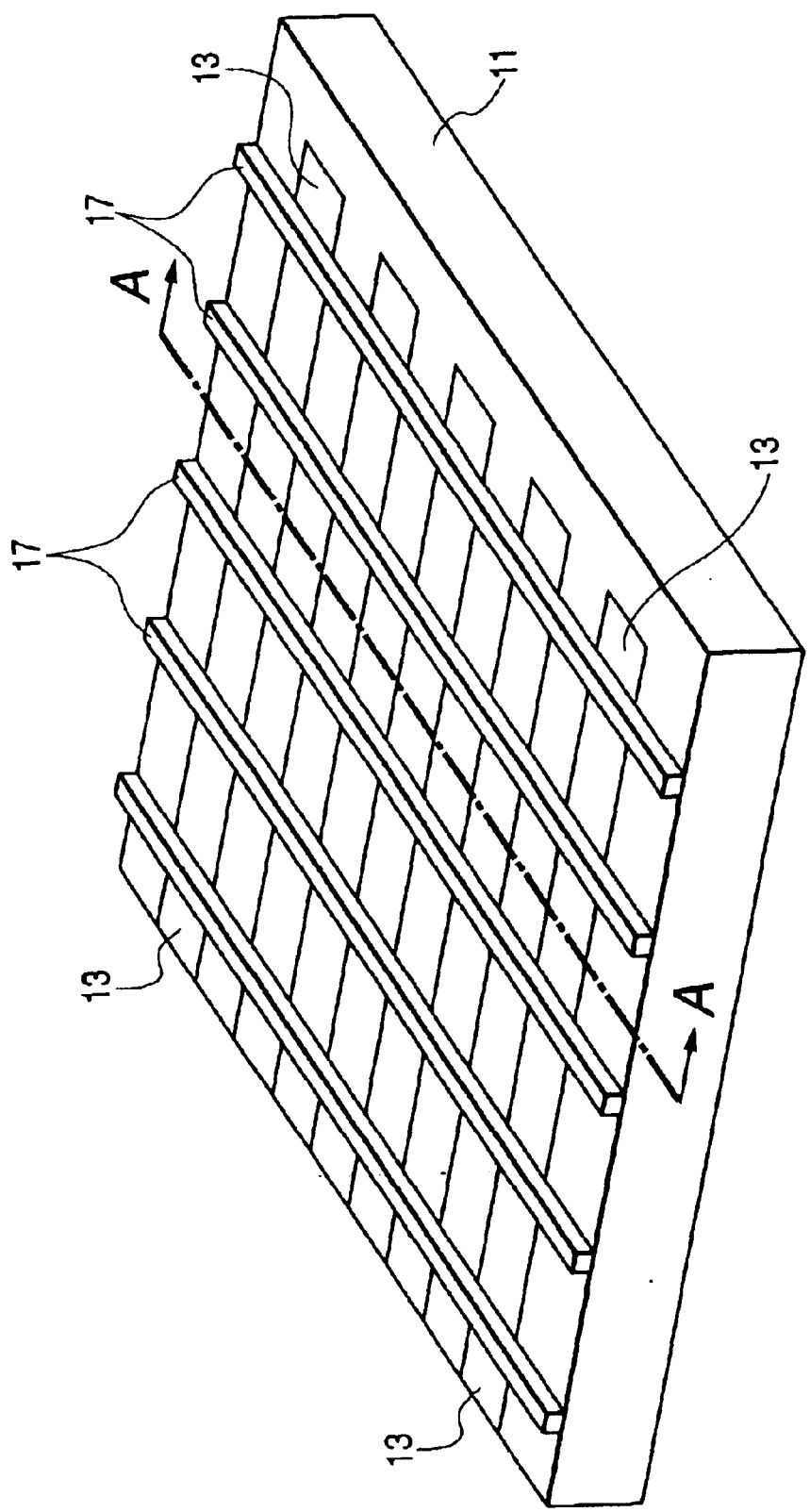
FIG. 3 is a perspective view schematically showing a process of making films in the organic EL display panel according to the embodiment of the invention.

A process of manufacturing the organic EL display panel 10 will be described below. First, as shown in FIG. 3, a plurality of conductive transparent films of ITO or the like in stripes are formed as first electrodes 13 (anodes) over a transparent substrate 11 such as glass. The conductive transparent films maybe patterned using the photolithography, for example. Next, the separation walls 17 of an inverted taper shape are formed. The separation walls 17 are formed of an insulating material such as photoresist by using the photolithography, dry etching or wet etching.

With the first electrodes 13 and the separation walls 17 formed, the organic EL medium layers 18 and the second electrodes 19 are formed. In the following, the process of forming the organic EL medium layers 18 will be explained in the order of a hole injection layer, a hole transport layer, a light emitting layer, an electron transport layer and an electron injection layer, all making up the organic EL medium layers 18.

Figure 4A:
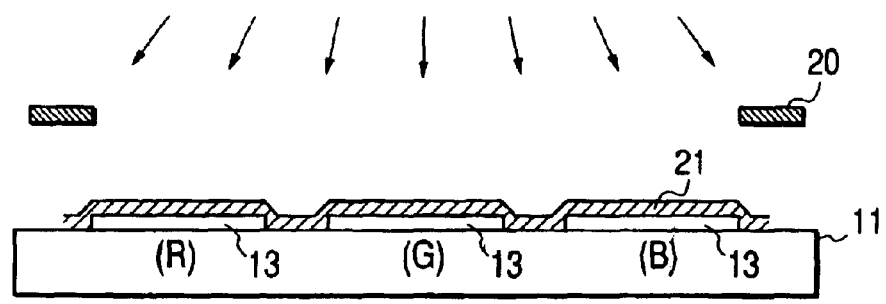
FIGS. 4A and 4B are cross sections showing a process of forming hole injection layers and hole transport layers in the organic EL display panel according to the first embodiment of the invention.
Figure 4B:
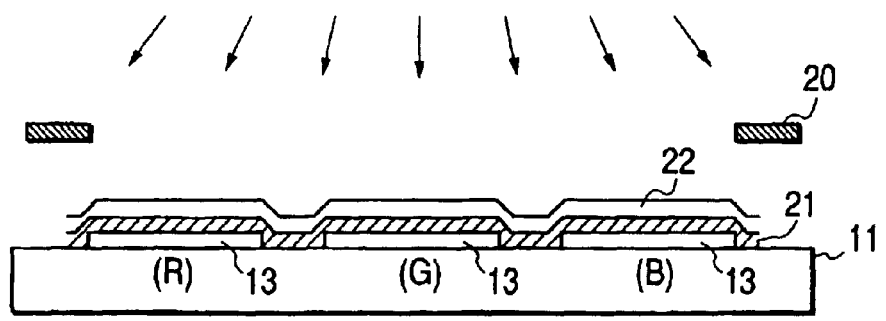

FIGS. 4A to 4C are cross sections taken along the line A—A through the color organic EL display panel 10 of FIG. 3, showing the process of making the hole injection layer 21 and the hole transport layer 22. First, as shown in FIG. 4A, the hole injection layer 21 is formed to a predetermined thickness by a vapor deposition method using a mask 20. In this process, an angle vapor deposition method, in which a vapor flow is at more than a predetermined angle to the normal of the substrate 11, is used to ensure that the vapor material wraps around to provide a satisfactory coverage. The deposition angle in the angle vapor deposition method can be achieved by adjusting the positional relations, such as distance and angle, between the substrate 11 and the vapor source. It is also possible to combine the above deposition method with additional methods of mounting the substrate in a tilted position and of rotating the substrate on its axis and around an orbit.

After the hole injection layer 21 is formed, the hole transport layer 22 is deposited to a predetermined thickness as shown in FIG. 4B. In the process of forming the hole transport layer 22, too, the angle vapor deposition is performed to provide a satisfactory coverage, as in the case with the hole injection layer 21.

Figure 5A:
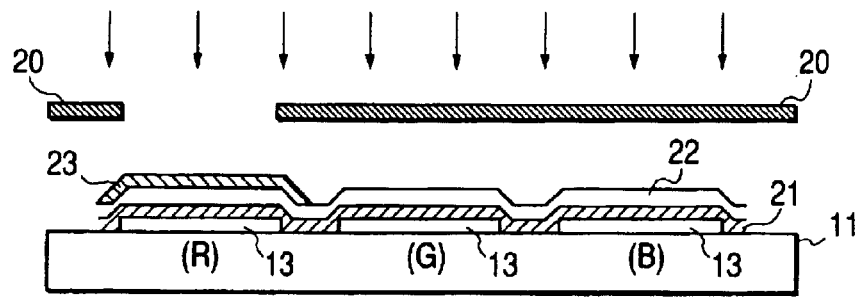
FIGS. 5A to 5C are cross sections showing a process of forming light emitting layers in the organic EL display panel according to the first embodiment of the invention.
Figure 5B:
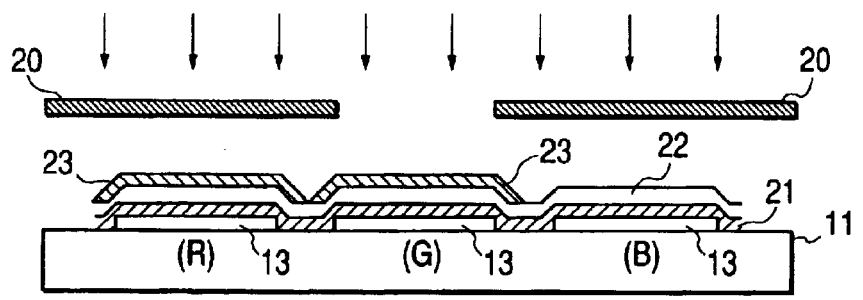
Figure 5C:
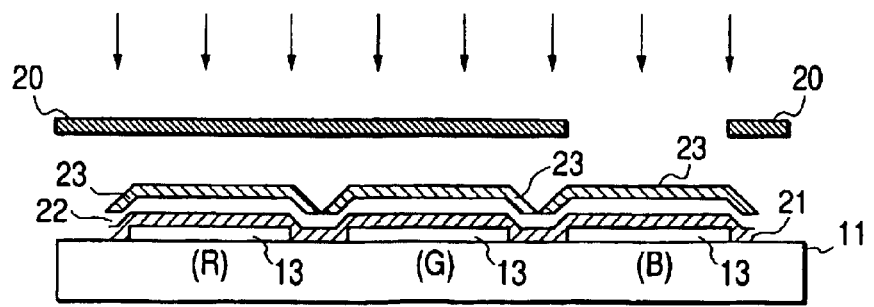

Next, as shown in FIGS. 5A to 5C, by using the mask 20, organic materials for RGB light emitting layers are selectively deposited over the associated light emitting areas on the substrate 11 on which the hole injection layer 21 and the hole transport layer 22 were formed. First, the mask 20 is positioned and set to align its opening with the light emitting area corresponding to a red light emitting portion (R), as shown in FIG. 5A. Then a red luminous organic material is deposited to a predetermined thickness to form a red light emitting layer 23. In this process, unlike the process of depositing the hole injection layer 21 and the hole transport layer 22, the deposition is performed at less than a predetermined angle to the normal of the substrate 11 to prevent unwanted wraparound of vapor material. This deposition angle may be determined according to the conditions, such as presence or absence of the separation walls 17, height or taper angle of the separation walls 17, and wraparound margin of vapor. The direction of deposition may be set nearly perpendicular to the substrate 11.

After the red light emitting layer 23 is formed, the opening of the mask 20 is positioned and aligned with the light emitting area corresponding to the green light emitting portion (G). Then a green luminous organic material is deposited to a predetermined thickness to form a green light emitting layer 23, as shown in FIG. 5B. In this process, as with the red light emitting layer 23, the deposition is performed at less than a predetermined angle. The predetermined thickness needs only to be appropriate for the green light emitting layer 23 and, though normally different from the thickness of the red light emitting layer 23, maybe set equal to it. With the green light emitting layer 23 formed, the mask 20 is positioned and aligned as shown in FIGS. 5A to 5C as in the case with the red and green light emitting layers 23, and a blue light emitting layer 23 is formed to a predetermined thickness. This predetermined thickness needs only to be appropriate for the blue light emitting layer 23.

Figure 6A:
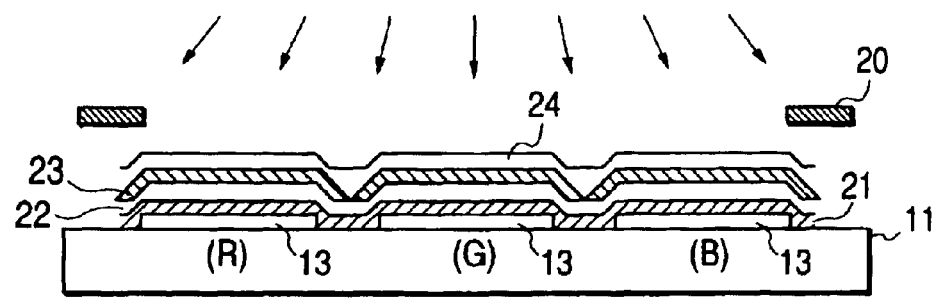
FIGS. 6A to 6C are cross sections showing a process of forming electron transport layers and electron injection layers in the organic EL display panel according to the first embodiment of the invention.
Figure 6B:
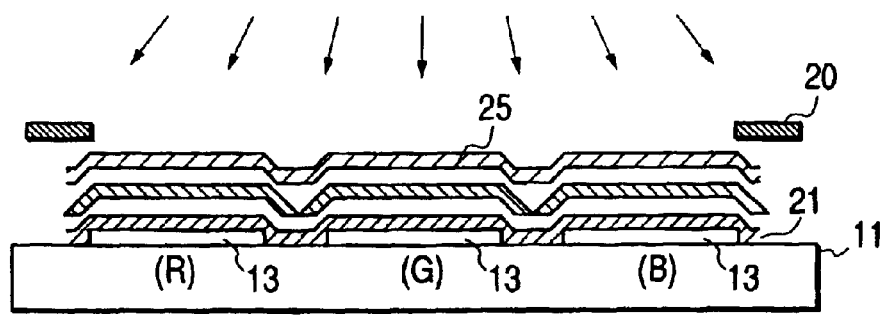
Figure 6C:
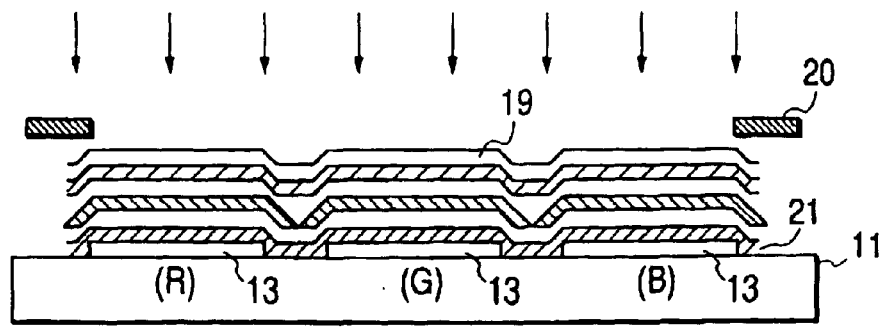

After the RGB light emitting layers 23 are formed, the electron transport layer 24 and the electron injection layer 25 are formed successively. As shown in FIG. 6A, the electron transport layer 24 is first deposited to a predetermined thickness. In this process, the angle deposition is employed, as in the case with the hole injection layer 21 and the hole transport layer 22, to obtain a satisfactory coverage. After the electron transport layer 24 is formed, the electron injection layer 25 is deposited to a predetermined thickness, as shown in FIG. 6B. In this case, too, the angle deposition is performed to ensure a sufficient coverage.

Next, second electrodes (cathodes) are formed over the substrate that is already formed with the above-described organic medium layers. The second electrodes may be formed by depositing, for example, aluminum (Al) to a predetermined thickness by a resistance heating method. In the process of forming the second electrodes, the deposition is performed at less than a predetermined angle to the normal of the substrate 11, for example in an almost vertical direction with respect to the substrate 11, to avoid electric short-circuits caused by vapor wraparound.

As described above, this invention can realize a high performance organic EL display panel without drawbacks such as vapor wraparound and insufficient coverage.

(Second Embodiment)

In the first embodiment described above, the organic medium layers except for the RGB light emitting layers 23 are formed simultaneously for all RGB light emitting areas in one deposition process, whereas in this embodiment the organic medium layers are formed under different conditions for different RGB light emitting areas.

Figure 7A:
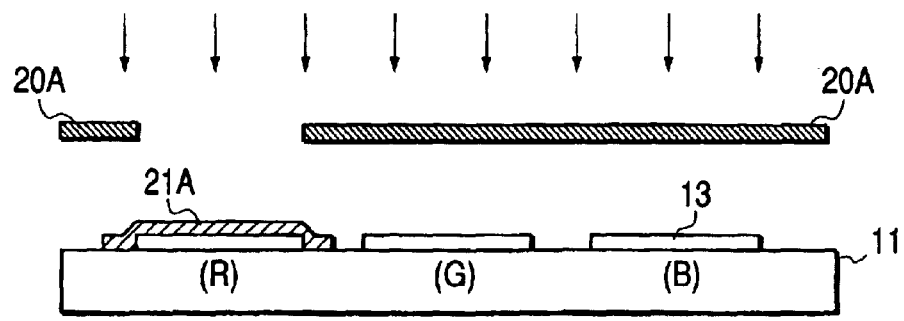
FIGS. 7A and 7B are cross sections showing a process of forming hole transport layers in the organic EL display panel according to a second embodiment of the invention.
Figure 7B:
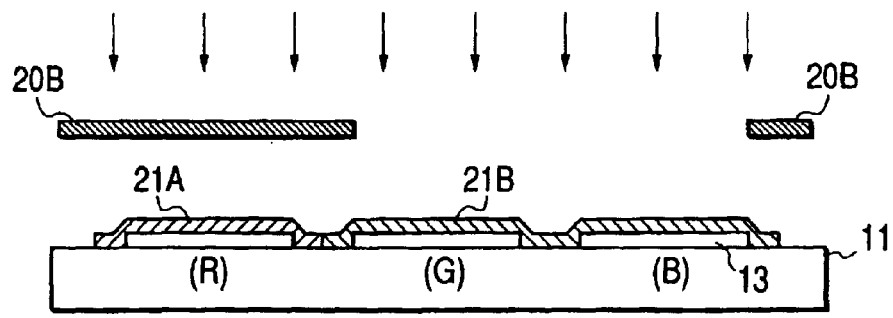

FIGS. 7A and 7B are cross sections schematically showing the process of manufacturing the full color organic EL display panel 10 as a second embodiment of this invention. In the following we will explain about a case where the hole transport layers 22A, 22B as the first organic EL medium layers are deposited over the substrate 11 already formed with the first electrodes 13 and the separation walls 17.

First, as shown in FIG. 7A, the mask 20A is positioned and set to align its opening with the light emitting area corresponding to the red light emitting portion (R) and then the hole transport layer 22A is deposited to a predetermined thickness. The thickness, material and composition of the hole transport layer 22A are preferably selected to be optimum for the red light emitting portion. To prevent the wraparound of vapor being deposited, the deposition is performed at less than a predetermined angle to the normal of the substrate 11, for example in an almost vertical direction with respect to the substrate 11.

Next, as shown in FIG. 7B, the mask 20B is positioned and set to align its opening with the light emitting areas corresponding to the green light emitting portion (G) and the blue light emitting portion (B), and then the hole transport layer 22B is deposited to a predetermined thickness. The thickness, material and composition of the hole transport layer 22B are preferably selected to be optimum for the green and blue light emitting portions. The deposition is similarly performed at less than a predetermined angle to the normal of the substrate 11, for example in an almost vertical direction with respect to the substrate 11.

Further, the organic medium layers deposited over the green light emitting portion (G) and the blue light emitting portion (B) may be formed under different film making conditions. The film making method described above can also be applied to other organic medium layers.

As explained above, with the present invention it is possible to form the organic medium layers over different light emitting areas under different film making conditions, thereby realizing a high performance organic EL display panel with no such problems as vapor wraparound and insufficient coverage.

In the above embodiments, an organic EL display panel with separation walls is taken as an example case. This invention is also applicable to a case where the organic EL medium layers are patterned by using a mask or photolithography technique without forming separation walls.

The method of depositing the organic EL medium layers and electrode layers include various kinds of film making methods and deposition methods having directivity.

In the above embodiment, the organic EL medium layers are formed over the anodes. This invention is also applicable where the organic EL medium layers are formed over cathodes. Further, a variety of organic EL medium layers and electrode layers as well as their film making conditions have been described by way of example only, and they can be properly selected, combined or modified as required.

(Third Embodiment)

FIGS. 8 to 11C show a method of forming layers of organic EL medium according to a third embodiment of the invention. That is, the first electrodes 13 (anodes) made of an ITO film are formed in stripes over the transparent glass substrate 11, and then individual organic EL medium layers are formed according to the film deposition process shown in FIG. 8. These organic EL medium layers are formed by a vapor deposition method, for example. FIGS. 9A to 11C are cross sections showing a process of manufacturing an organic EL display panel.

Figure 9A:
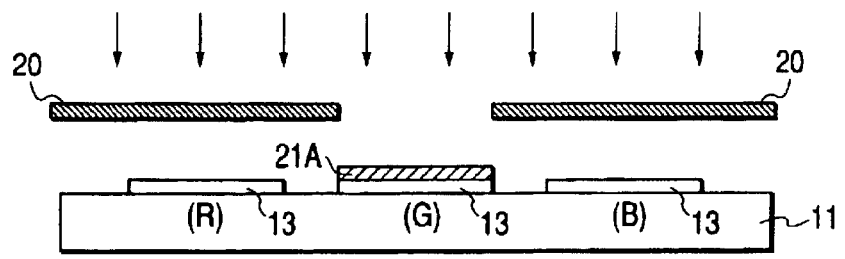
FIGS. 9A to 9C are cross sections showing the process of manufacturing an organic EL display panel according to the third embodiment of the invention.
Figure 9B:
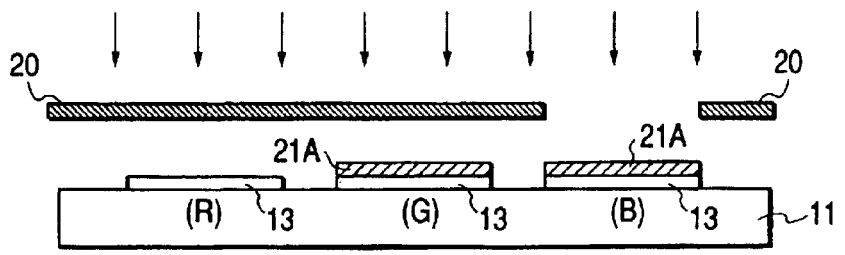

A hole transport layer 21 is first formed such that final thicknesses of the layers 21 for R, G and B light emitting portions are 50, 70 and 100 nm, respectively. First, using a mask 20, the RGB light emitting areas are deposited with layers to differential thicknesses that are equal to a common layer thickness subtracted from the respective final layer thicknesses. That is, the films are deposited in the RGB light emitting areas to the differential thicknesses of 0, 20 and 50 nm, respectively, that are obtained by subtracting the common layer thickness of 50 nm from the final thicknesses of the respective light emitting areas. More specifically, as shown in FIG. 9A, in a first step the mask 20 is positioned and set by aligning its opening with the light emitting area corresponding to the green (G) light emitting portion. Then, a hole transport layer 21A is deposited to the differential thickness for green (G) of 20 nm. Then, as shown in FIG. 9B, in a second step the mask 20 is shifted by one cycle of the light emitting areas to align the opening with the blue (B) light emitting area. The hole transport layer 21A is then deposited to the differential thickness for blue (B) of 50 nm.

Figure 9C:
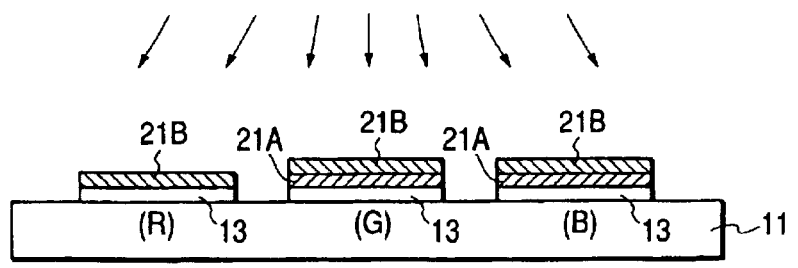

Next, as shown in FIG. 9C, in a third step the mask 20 is removed and a hole transport layer 21B is deposited commonly for all the RGB light emitting areas to a thickness of 50 nm. In this way, the hole transport layers 21 consisting of hole transport layers 21A and 21B can be formed over the RGB light emitting areas to different thicknesses.

When forming the hole transport layers 21A over the light emitting portions to their respective differential thicknesses, the vapor deposition is preferably performed such that the direction of a vapor flow is at less than a predetermined angle to the normal of the substrate 11, to prevent the wraparound of the vapor flow of the organic EL material. When forming the hole transport layers 21B at one time, on the other hand, the vapor deposition is preferably performed such that the direction of vapor flow is at a predetermined angle to the normal of the substrate 11 (hereafter referred to as an angle vapor deposition) to avoid shadowing due to debris or projections and secure good coverage.

Figure 10A:
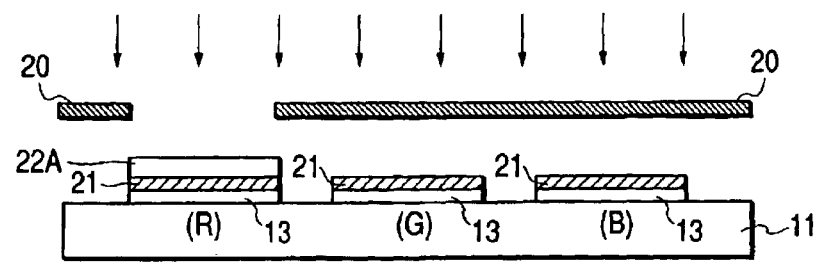
FIGS. 10A to 10C are cross sections showing the process of manufacturing an organic EL display panel according to the third embodiment of the invention.
Figure 10B:
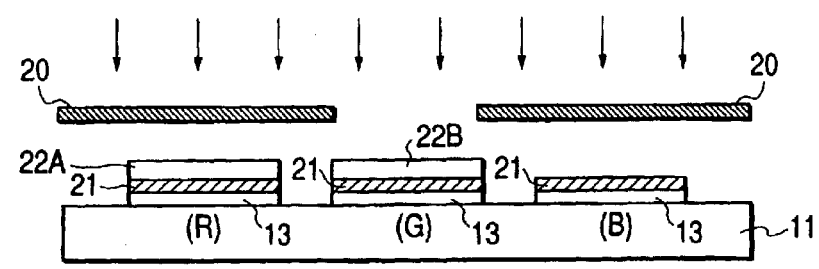
Figure 10C:
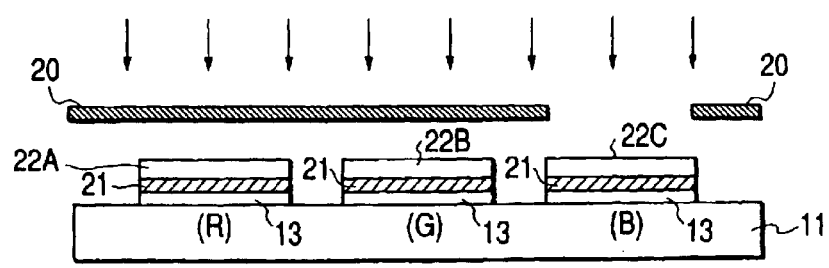

As described above, after the hole transport layer 21 is deposited, a light emitting layer 22 is formed. First, as shown in FIG. 10A, the mask 20 is positioned and set by aligning its opening with the light emitting area corresponding to the red (R) light emitting portion. Then, a light emitting layer 22A for red (R) is deposited to a predetermined thickness (d(R)) (fourth step in FIG. 8). Next, as shown in FIG. 10B, the mask 20 is shifted by one cycle of the light emitting areas to align the opening with the green (G) light emitting area. A light emitting layer 22B for green (G) is deposited to a predetermined thickness (d(G)) (fifth step). Further, in the similar manner as shown in FIG. 10C, a light emitting layer 22C for blue (B) is deposited to a predetermined thickness (d(B)) (sixth step). In this way, the R, G and B light emitting areas can be deposited with the light emitting layers 22 of different organic EL materials. During the process of forming the light emitting layers 22A, 22B, 22C, the direction of the vapor flow is preferably set at a predetermined angle or less to the normal of the substrate 11.

Figure 11A:
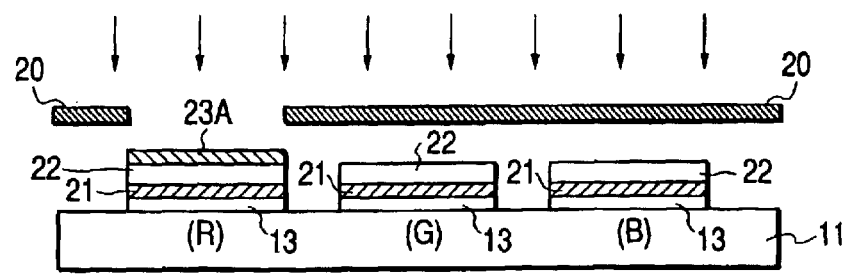
FIGS. 11A to 11C are cross sections showing the process of manufacturing an organic EL display panel according to the third embodiment of the invention.
Figure 11B:
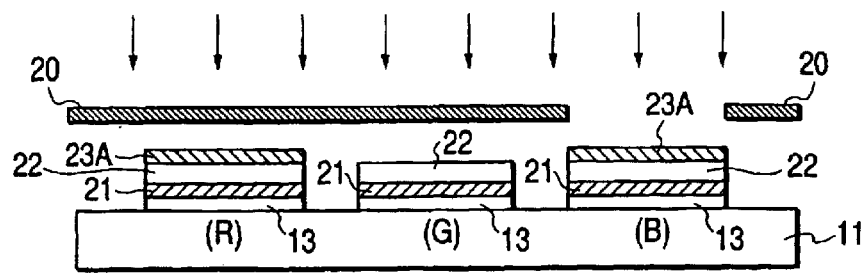

After the light emitting layer 22 is formed, an electron transport layer 23 is formed such that final thicknesses of the layers 23 for R, G and B light emitting portions are 80, 20 and 50 nm, respectively. First, using the mask 20, the RGB light emitting areas are deposited with layers to differential thicknesses that are equal to a common layer thickness subtracted from the respective final layer thicknesses. That is, the films are deposited in the RGB light emitting areas to the differential thicknesses of 60, 0 and 30 nm, respectively, that are obtained by subtracting the common layer thickness of 20 nm from the final thicknesses of the respective light emitting areas. More specifically, as shown in FIG. 11A, the mask 20 is positioned and set by aligning its opening with the light emitting area corresponding to the red (R) light emitting portion. Then, an electron transport layer 23A is deposited to the differential thickness for red (R) of 60 nm (seventh step). Next, as shown in FIG. 11B, the mask 20 is shifted by two cycles of the light emitting areas to align the opening with the blue (B) light emitting area, and then the electron transport layer 23A is deposited to the differential thickness for blue (B) of 30 nm (eighth step).

Figure 11C:
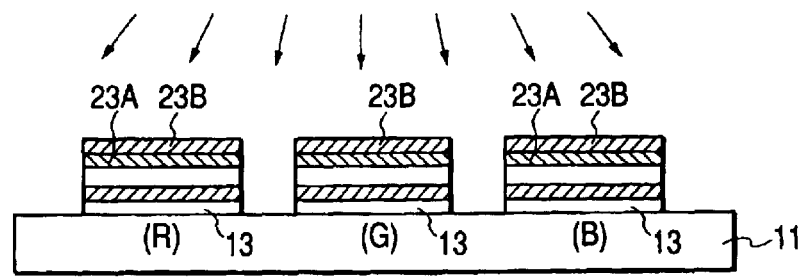
Figure 12:
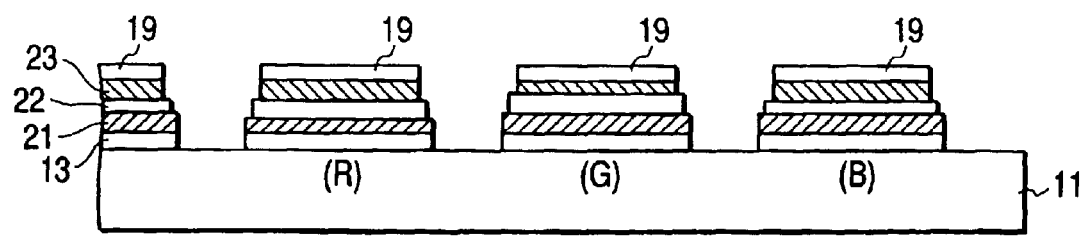
FIG. 12 is a cross section of an organic EL display panel as the third embodiment of the invention.

Next, as shown in FIG. 11C, the mask is removed and an electron transport layer 23B is commonly deposited over all the RGB light emitting areas to a thickness of 20 nm (ninth step). In this way, the electron transport layer 23 consisting of electron transport layers 23A and 23B can be formed over the RGB light emitting areas to different thicknesses.

As in the case with the formation of the hole transport layer 21, during the vapor deposition of the electron transport layers 23A to the differential thicknesses, the direction of the vapor flow is preferably set at a predetermined angle or less to the normal of the substrate 11 and, during the vapor deposition of the common electron transport layer 23B, the angle vapor deposition is preferably performed.

As described above, after each organic EL layer is formed, the second electrodes (cathodes) 19 made of metal for example is formed over the organic EL medium layers between the separation walls 17, thus manufacturing the organic EL display panel 10.

As described above, this invention allows the organic EL medium layers of different luminous colors to be formed to their optimum thicknesses, thus realizing a high performance full color organic EL display panel.

In the above embodiment, we have explained a case where organic EL medium layers for different luminous colors are formed to different thicknesses (different differential thicknesses) and then organic EL medium layers of equal thicknesses for all luminous colors are formed at one time. It is possible to form the organic EL medium layers of equal thicknesses for all light emitting areas first.

It is also noted that this invention is not limited to the application where both the hole transport layer and the electronic transport layer are provided. It can also be applied to where only one of these transport layers is provided. Further, the organic EL medium layer is not limited to the hole transport layer and electron transport layer. It may, for example, be a hole injection layer and an electron injection layer. Although in the above embodiment the organic EL medium layers are formed over an anode, they may be formed over a cathode. The organic EL medium layers and their thicknesses have been described by way of example only and may be modified as required.

As can be seen from the foregoing, this invention can realize a high performance organic EL display panel.

What is claimed is:

1. A method of manufacturing an organic electroluminescent display panel having light emitting portions in a plurality of luminous colors formed on a substrate, said method comprising:

forming first electrodes on the substrate;

forming organic layers in associated light emitting areas, the organic layers having different thicknesses for different luminous colors of the plurality of luminous colors;

forming light emitting layers for the plurality of luminous colors in the associated light emitting areas; and forming second electrode, wherein the organic layer forming step includes forming organic layers of equal thicknesses for all the luminous colors of the plurality of luminous colors at one time and forming organic layers for colors of the plurality of luminous colors different in thickness for different luminous colors.

2. The method according to claim 1, wherein in the organic layers forming step, forming organic layers of different thicknesses is performed prior to forming the organic layers of equal thicknesses.

3. The method according to claim 1, wherein the organic layers are each made of the same organic material.

4. The method of manufacturing an organic electroluminescent display panel having light emitting portions in a plurality of luminous colors formed on a substrate, said method comprising:

forming first electrodes on the substrate;

forming organic layers in associated light emitting areas on the substrate on which the first electrodes were formed, the organic layers having different thicknesses for different luminous colors;

forming light emitting layers for the plurality of luminous colors in the associated light emitting areas after performing the organic layer forming step; and forming second electrodes after the forming of the organic layers, wherein the forming of the organic layers includes forming organic layers of equal thicknesses for all the luminous colors of the plurality of luminous colors at one time and forming organic layers for colors of the plurality of luminous colors different in thickness for different luminous colors.

5. The method according to claim 4, wherein in the organic layers forming step, forming organic layers of different thicknesses for different luminous colors is performed prior to the forming of the organic layers of equal thicknesses for all the luminous colors.

6. The method according to claim 4, further comprising forming organic layers of different thicknesses for different luminous colors in the associated light emitting areas after performing the light emitting layer forming step.

7. The method of manufacturing an organic electroluminescent display panel having light emitting portions in a plurality of luminous colors formed on a substrate, said method comprising:

forming first electrodes on the substrate;

forming light emitting layers for the plurality of luminous colors in associated light emitting areas;

forming organic layers in the associated light emitting areas on the substrate on which the first electrodes were formed, the organic layers having different thicknesses for different luminous colors after performing the light emitting layer forming step; and forming second electrodes after performing the organic layers forming step, wherein the forming of the organic layers includes forming organic layers of equal thicknesses for all the luminous colors at one time and forming organic layers of different thicknesses for different luminous colors.

8. The method according to claim 7, wherein in the forming of the organic layers, forming organic layers of different thicknesses for different luminous colors is performed prior to the step of forming organic layers of equal thicknesses for all the luminous colors.

9. The method according to claim 4 or claim 7, wherein the organic layers comprise a hole transport layer.

10. The method according to claim 4 or claim 7, wherein the organic layers comprise an electron transport layer.

* * * * *